(12) United States Patent
Liao et al.

(10) Patent No.: US 8,999,793 B2
(45) Date of Patent: Apr. 7, 2015

(54) MULTI-GATE FIELD-EFFECT TRANSISTOR PROCESS

(71) Applicant: United Microelectronics Corp., Hsin-Chu (TW)

(72) Inventors: Chin-I Liao, Tainan (TW); Chia-Lin Hsu, Tainan (TW); Ming-Yen Li, Taichung (TW); Yung-Lun Hsieh, Tainan (TW); Chien-Hao Chen, Yunlin County (TW); Bo-Syuan Lee, Tainan (TW)

(73) Assignee: United Microelectronics Corp., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/306,250

(22) Filed: Jun. 17, 2014

(65) Prior Publication Data

US 2014/0295634 A1    Oct. 2, 2014

Related U.S. Application Data

(62) Division of application No. 13/530,127, filed on Jun. 22, 2012, now Pat. No. 8,796,695.

(51) Int. Cl.
*H01L 29/66*  (2006.01)
*H01L 29/78*  (2006.01)
*H01L 29/10*  (2006.01)

(52) U.S. Cl.
CPC ........ *H01L 29/66795* (2013.01); *H01L 29/785* (2013.01); *H01L 29/1054* (2013.01); *H01L 29/66484* (2013.01)

(58) Field of Classification Search
CPC .............. H01L 27/1211; H01L 21/845; H01L 29/66545; H01L 29/1054; H01L 29/7848; H01L 29/66651
USPC ......... 257/192, 255, 618, 300, 368, 401, 310, 257/402; 438/604, 710
See application file for complete search history.

(56) References Cited

U.S. PATENT DOCUMENTS

| | | | |
|---|---|---|---|
| 4,891,303 A | 1/1990 | Garza |
| 5,217,910 A | 6/1993 | Shimizu |
| 5,273,930 A | 12/1993 | Steele |
| 5,356,830 A | 10/1994 | Yoshikawa |
| 5,372,957 A | 12/1994 | Liang |
| 5,385,630 A | 1/1995 | Philipossian |
| 5,399,506 A | 3/1995 | Tsukamoto |
| 5,625,217 A | 4/1997 | Chau |
| 5,777,364 A | 7/1998 | Crabbe |
| 5,783,478 A | 7/1998 | Chau |

(Continued)

*Primary Examiner* — Kenneth Parker
*Assistant Examiner* — Bo Fan
(74) *Attorney, Agent, or Firm* — Winston Hsu; Scott Margo

(57) ABSTRACT

A Multi-Gate Field-Effect Transistor includes a fin-shaped structure, a gate structure, at least an epitaxial structure and a gradient cap layer. The fin-shaped structure is located on a substrate. The gate structure is disposed across a part of the fin-shaped structure and the substrate. The epitaxial structure is located on the fin-shaped structure beside the gate structure. The gradient cap layer is located on each of the epitaxial structures. The gradient cap layer is a compound semiconductor, and the concentration of one of the ingredients of the compound semiconductor has a gradient distribution decreasing from inner to outer. Moreover, the present invention also provides a Multi-Gate Field-Effect Transistor process forming said Multi-Gate Field-Effect Transistor.

7 Claims, 3 Drawing Sheets

(56) References Cited

U.S. PATENT DOCUMENTS

| | | |
|---|---|---|
| 5,783,479 A | 7/1998 | Lin |
| 5,960,322 A | 9/1999 | Xiang |
| 6,030,874 A | 2/2000 | Grider |
| 6,043,138 A | 3/2000 | Ibok |
| 6,048,756 A | 4/2000 | Lee |
| 6,074,954 A | 6/2000 | Lill |
| 6,100,171 A | 8/2000 | Ishida |
| 6,110,787 A | 8/2000 | Chan |
| 6,165,826 A | 12/2000 | Chau |
| 6,165,881 A | 12/2000 | Tao |
| 6,191,052 B1 | 2/2001 | Wang |
| 6,228,730 B1 | 5/2001 | Chen |
| 6,274,447 B1 | 8/2001 | Takasou |
| 6,355,533 B2 | 3/2002 | Lee |
| 6,365,476 B1 | 4/2002 | Talwar |
| 6,368,926 B1 | 4/2002 | Wu |
| 6,444,591 B1 | 9/2002 | Schuegraf |
| 6,492,216 B1 | 12/2002 | Yeo |
| 6,537,370 B1 | 3/2003 | Hernandez |
| 6,544,822 B2 | 4/2003 | Kim |
| 6,605,498 B1 | 8/2003 | Murthy |
| 6,613,695 B2 | 9/2003 | Pomarede |
| 6,621,131 B2 | 9/2003 | Murthy |
| 6,624,068 B2 | 9/2003 | Thakar |
| 6,632,718 B1 | 10/2003 | Grider |
| 6,642,122 B1 | 11/2003 | Yu |
| 6,664,156 B1 | 12/2003 | Ang |
| 6,676,764 B2 | 1/2004 | Joo |
| 6,699,763 B2 | 3/2004 | Grider |
| 6,703,271 B2 | 3/2004 | Yeo |
| 6,777,275 B1 | 8/2004 | Kluth |
| 6,800,910 B2 | 10/2004 | Lin |
| 6,806,151 B2 | 10/2004 | Wasshuber |
| 6,809,402 B1 | 10/2004 | Hopper |
| 6,858,506 B2 | 2/2005 | Chang |
| 6,861,318 B2 | 3/2005 | Murthy |
| 6,864,135 B2 | 3/2005 | Grudowski |
| 6,869,867 B2 | 3/2005 | Miyashita |
| 6,887,751 B2 | 5/2005 | Chidambarrao |
| 6,887,762 B1 | 5/2005 | Murthy |
| 6,891,192 B2 | 5/2005 | Chen |
| 6,921,963 B2 | 7/2005 | Krivokapic |
| 6,930,007 B2 | 8/2005 | Bu |
| 6,946,350 B2 | 9/2005 | Lindert |
| 6,962,856 B2 | 11/2005 | Park |
| 6,972,461 B1 | 12/2005 | Chen |
| 6,991,979 B2 | 1/2006 | Ajmera |
| 6,991,991 B2 | 1/2006 | Cheng |
| 7,037,773 B2 | 5/2006 | Wang |
| 7,060,576 B2 | 6/2006 | Lindert |
| 7,060,579 B2 | 6/2006 | Chidambaram |
| 7,087,477 B2 | 8/2006 | Fried |
| 7,091,551 B1 | 8/2006 | Anderson |
| 7,112,495 B2 | 9/2006 | Ko |
| 7,118,952 B2 | 10/2006 | Chen |
| 7,132,338 B2 | 11/2006 | Samoilov |
| 7,169,675 B2 | 1/2007 | Tan |
| 7,183,596 B2 | 2/2007 | Wu |
| 7,202,124 B2 | 4/2007 | Fitzgerald |
| 7,217,627 B2 | 5/2007 | Kim |
| 7,247,887 B2 | 7/2007 | King |
| 7,250,658 B2 | 7/2007 | Doris |
| 7,288,822 B1 | 10/2007 | Ting |
| 7,303,999 B1 | 12/2007 | Sriraman |
| 7,309,626 B2 | 12/2007 | Ieong |
| 7,335,959 B2 | 2/2008 | Curello |
| 7,352,034 B2 | 4/2008 | Booth, Jr. |
| 7,410,859 B1 | 8/2008 | Peidous |
| 7,462,239 B2 | 12/2008 | Brabant |
| 7,470,570 B2 | 12/2008 | Beintner |
| 7,491,615 B2 | 2/2009 | Wu |
| 7,494,856 B2 | 2/2009 | Zhang |
| 7,494,858 B2 | 2/2009 | Bohr |
| 7,531,437 B2 | 5/2009 | Brask |
| 7,569,857 B2 | 8/2009 | Shaheen |
| 7,592,231 B2 | 9/2009 | Cheng |
| 7,667,227 B2 | 2/2010 | Shimamune |
| 7,691,752 B2 | 4/2010 | Ranade |
| 7,838,370 B2 | 11/2010 | Mehta |
| 2002/0160587 A1 | 10/2002 | Jagannathan |
| 2002/0182423 A1 | 12/2002 | Chu |
| 2003/0181005 A1 | 9/2003 | Hachimine |
| 2003/0203599 A1 | 10/2003 | Kanzawa |
| 2004/0045499 A1 | 3/2004 | Langdo |
| 2004/0067631 A1 | 4/2004 | Bu |
| 2004/0195624 A1 | 10/2004 | Liu |
| 2004/0227164 A1 | 11/2004 | Lee |
| 2005/0051825 A1 | 3/2005 | Fujiwara |
| 2005/0070076 A1 | 3/2005 | Dion |
| 2005/0079692 A1 | 4/2005 | Samoilov |
| 2005/0082616 A1 | 4/2005 | Chen |
| 2005/0139231 A1 | 6/2005 | Abadie |
| 2005/0260830 A1 | 11/2005 | Kwon |
| 2005/0285193 A1 | 12/2005 | Lee |
| 2005/0287752 A1 | 12/2005 | Nouri |
| 2006/0051922 A1 | 3/2006 | Huang |
| 2006/0057859 A1 | 3/2006 | Chen |
| 2006/0071275 A1* | 4/2006 | Brask et al. ................... 257/350 |
| 2006/0076627 A1 | 4/2006 | Chen |
| 2006/0088968 A1 | 4/2006 | Shin |
| 2006/0099830 A1 | 5/2006 | Walther |
| 2006/0115949 A1 | 6/2006 | Zhang |
| 2006/0163558 A1 | 7/2006 | Lee |
| 2006/0228842 A1 | 10/2006 | Zhang |
| 2006/0231826 A1 | 10/2006 | Kohyama |
| 2006/0258126 A1 | 11/2006 | Shiono |
| 2006/0281288 A1 | 12/2006 | Kawamura |
| 2006/0286729 A1 | 12/2006 | Kavalieros |
| 2006/0292779 A1 | 12/2006 | Chen |
| 2006/0292783 A1 | 12/2006 | Lee |
| 2007/0023847 A1 | 2/2007 | Rhee |
| 2007/0034906 A1 | 2/2007 | Wang |
| 2007/0049014 A1 | 3/2007 | Chen |
| 2007/0072353 A1 | 3/2007 | Wu |
| 2007/0072376 A1 | 3/2007 | Chen |
| 2007/0082451 A1 | 4/2007 | Samoilov |
| 2007/0108528 A1 | 5/2007 | Anderson |
| 2007/0128783 A1 | 6/2007 | Ting |
| 2007/0158756 A1 | 7/2007 | Dreeskornfeld |
| 2007/0166929 A1 | 7/2007 | Matsumoto |
| 2007/0262396 A1 | 11/2007 | Zhu |
| 2008/0014688 A1 | 1/2008 | Thean |
| 2008/0061366 A1 | 3/2008 | Liu |
| 2008/0067545 A1 | 3/2008 | Rhee |
| 2008/0076236 A1 | 3/2008 | Chiang |
| 2008/0085577 A1 | 4/2008 | Shih |
| 2008/0116525 A1 | 5/2008 | Liu |
| 2008/0124874 A1 | 5/2008 | Park |
| 2008/0128746 A1 | 6/2008 | Wang |
| 2008/0142886 A1 | 6/2008 | Liao |
| 2008/0157208 A1 | 7/2008 | Fischer |
| 2008/0220579 A1 | 9/2008 | Pal |
| 2008/0233722 A1 | 9/2008 | Liao |
| 2008/0233746 A1 | 9/2008 | Huang |
| 2009/0039389 A1 | 2/2009 | Tseng |
| 2009/0045456 A1 | 2/2009 | Chen |
| 2009/0095992 A1 | 4/2009 | Sanuki |
| 2009/0117715 A1 | 5/2009 | Fukuda |
| 2009/0124056 A1 | 5/2009 | Chen |
| 2009/0124097 A1 | 5/2009 | Cheng |
| 2009/0166625 A1 | 7/2009 | Ting |
| 2009/0184402 A1 | 7/2009 | Chen |
| 2009/0186475 A1 | 7/2009 | Ting |
| 2009/0242964 A1 | 10/2009 | Akil |
| 2009/0246922 A1 | 10/2009 | Wu |
| 2009/0269916 A1 | 10/2009 | Kang |
| 2009/0278170 A1 | 11/2009 | Yang |
| 2009/0302348 A1 | 12/2009 | Adam |
| 2010/0001317 A1 | 1/2010 | Chen |
| 2010/0048027 A1 | 2/2010 | Cheng |

(56) References Cited

U.S. PATENT DOCUMENTS

| | | |
|---|---|---|
| 2010/0072553 A1 | 3/2010 | Xu |
| 2010/0093147 A1 | 4/2010 | Liao |
| 2010/0144121 A1 | 6/2010 | Chang |
| 2010/0167506 A1 | 7/2010 | Lin |
| 2010/0252862 A1 * | 10/2010 | Ko et al. ................. 257/192 |
| 2011/0042744 A1 | 2/2011 | Cheng |

* cited by examiner

MULTI-GATE FIELD-EFFECT TRANSISTOR PROCESS

CROSS REFERENCE TO RELATED APPLICATIONS

This application is a divisional application of and claims the benefit of U.S. patent application Ser. No. 13/530,127, filed Jun. 22, 2012.

BACKGROUND OF THE INVENTION

1. Field of the Invention

The present invention relates generally to a Multi-Gate Field-Effect Transistor and a process thereof, and more specifically to a Multi-Gate Field-Effect Transistor and a process thereof, that forms a gradient cap layer on an epitaxial structure.

2. Description of the Prior Art

With the increasing miniaturization of semiconductor devices, various Multi-Gate Field-Effect Transistor devices have been developed. The Multi-Gate Field-Effect Transistor is advantageous for the following reasons. First, manufacturing processes of Multi-Gate Field-Effect Transistor devices can be integrated into traditional logic device processes, and thus are more compatible. In addition, since the three-dimensional structure of the Multi-Gate Field-Effect Transistor increases the overlapping area between the gate and the substrate, the channel region is controlled more effectively. This therefore reduces drain-induced barrier lowering (DIBL) effect and short channel effect. Moreover, the channel region is longer for the same gate length. Therefore, the current between the source and the drain is increased.

In order to enhance performances of Multi-Gate Field-Effect Transistors and approaching demands of size miniature, crystal strain technology has been developed and applied in the Multi-Gate Field-Effect Transistors. Putting a strain on a semiconductor crystal alters the speed at which charges move through that crystal. Strain makes Multi-Gate Field-Effect Transistors work better by enabling electrical charges, such as electrons, to pass more easily through the silicon lattice of the gate channel. In the known arts, attempts have been made to use a strained silicon layer, which has been grown epitaxially on a silicon substrate with an epitaxial structure disposed in between. In this type of Multi-Gate Field-Effect Transistors, a strain occurs in the epitaxial structure due to the epitaxial structure which has a larger or a lower lattice constant than the silicon one, which results in altering the band structure, and the carrier mobility is increased. This enhances the speed performance of the Multi-Gate Field-Effect Transistors.

SUMMARY OF THE INVENTION

The present invention provides a Multi-Gate Field-Effect Transistor and a process thereof that can enhance the performances of a Multi-Gate Field-Effect Transistor by applying epitaxial structures.

The present invention provides a Multi-Gate Field-Effect Transistor including a fin-shaped structure, a gate structure, at least an epitaxial structure and a gradient cap layer. The fin-shaped structure is on a substrate. The gate structure is disposed across a part of the fin-shaped structure and the substrate. The epitaxial structure is located on the fin-shaped structure beside the gate structure. The gradient cap layer is located on each of the epitaxial structure, and the gradient cap layer is a compound semiconductor, wherein the concentration of an ingredient of the gradient cap layer has a gradient distribution decreasing from bottom (inner) to top (outer).

The present invention provides a Multi-Gate Field-Effect Transistor process including the following steps. A fin-shaped structure is formed on a substrate. A gate structure is formed and disposed across part of the fin-shaped structure and the substrate. At least an epitaxial structure is formed on the fin-shaped structure beside the gate structure. A gradient cap layer is formed on each of the epitaxial structures, wherein the gradient cap layer is a compound semiconductor, and the concentration of an ingredient of the gradient cap layer has a gradient distribution decreasing from bottom (inner) to top (outer).

According to the above, the present invention provides a Multi-Gate Field-Effect Transistor and process thereof, including forming the epitaxial structure on the fin-shaped structure, forming the gradient cap layer on the epitaxial structure, and adjusting the concentration distribution of an ingredient of the epitaxial structure and the gradient cap layer. For example, the concentration distribution of the ingredient of the epitaxial structure has a uniform concentration distribution, and the ingredient of the gradient cap layer has a gradient distribution decreasing from bottom (inner) to top (outer). In this way, the epitaxial structure and the gradient cap layer formed on the fin-shaped structure can be smooth, black spots in a surface of the gradient cap layer can be avoided, stresses forcing a gate channel from the epitaxial structure and the gradient cap layer, especially from the epitaxial structure, can be maintained.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
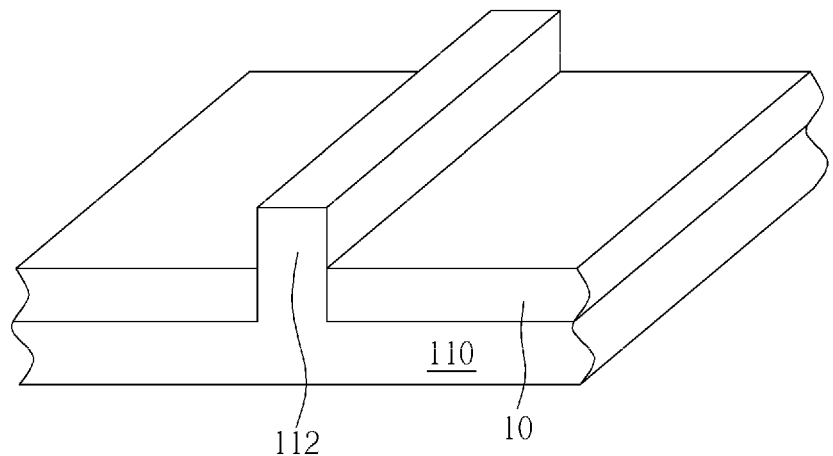
FIGS. 1-6 schematically depict cross-sectional views of a Multi-Gate Field-Effect Transistor process according to an embodiment of the present invention.

FIGS. 1-6 schematically depict cross-sectional views of a Multi-Gate Field-Effect Transistor process according to an embodiment of the present invention. As shown in FIG. 1, at least a fin-shaped structure 112 is formed on a substrate 110. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. In details, a bulk bottom substrate (not shown) is provided. A hard mask layer (not shown) is formed on the bulk bottom substrate (not shown) and is patterned to define the location of the fin-shaped structure 112, which will be formed in the bulk bottom substrate (not shown). An etching process is performed to form the fin-shaped structure 112 in the bulk bottom substrate (not shown). Thus, the fin-shaped structure 112 located on the substrate 110 is formed completely. An isolation structure 10 is formed on the substrate 110 except for the fin-shaped structure 112. The isolation structure 10 may be a shallow trench isolation (STI) structure, which is formed by a shallow trench isolation (STI) process, but it is not limited thereto.

In this embodiment, the hard mask layer (not shown) is removed after the fin-shaped structure 112 is formed, and a tri-gate MOSFET can be formed in the following processes.

There are three contact faces between the fin structure 112 and the following formed dielectric layer functioning as a carrier channel which width is wider than a channel width in a conventional planar MOSFET. When a driving voltage is applied, the tri-gate MOSFET produces an on-current twice higher than in conventional planar MOSFETs. In another embodiment, the hard mask layer (not shown) is reserved to form another kind of multi-gate MOSFET—fin field effect transistor (FinFET). Due to the hard mask layer (not shown) being reserved in the fin field effect transistor, there are only two contact faces between the fin-shaped structure 112 and the following formed dielectric layer.

The present invention can also be applied to other semiconductor substrates. For example, a silicon-on-insulator substrate (not shown) is provided, and then a single crystalline silicon layer being a top part of the silicon-on-insulator substrate (not shown) is etched till an oxide layer being a middle part of the silicon-on-insulator substrate (not shown) is exposed, meaning that the fin-shaped structure formed on the silicon-on-insulator substrate (not shown) is now finished. The structures formed by the method and this embodiment (as shown in FIG. 1) are slightly different. As shown in FIG. 1, the fin-shaped structure 112 is directly formed on the substrate 110, and the isolation structure 10 is formed on the substrate 110 except for the fin-shaped structure 112. However, in this method, the fin-shaped structure (not shown) is obtained by etching the single crystalline silicon layer being the top part of the silicon-on-insulator substrate (not shown), and so the fin-shaped structure (not shown) is located on the oxide layer, not on a (silicon) substrate.

In order to clarify the present invention, one fin-shaped structure 112 is depicted in this embodiment, but the present invention can also be applied to a plurality of fin-shaped structures 112. Then, shallow trench isolation (STI) structures 10 may be formed between each fin-shaped structure 112.

Figure 2:
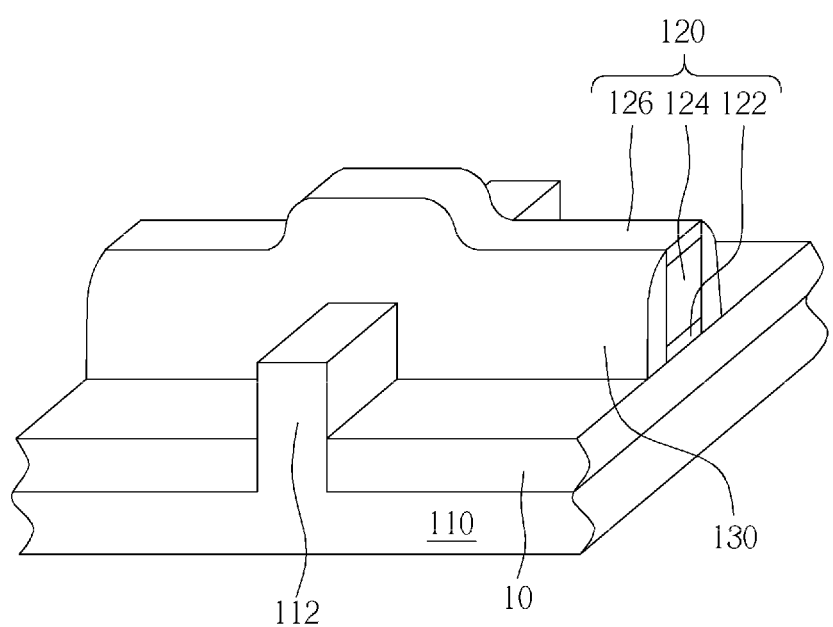

As shown in FIG. 2, a gate structure 120 is disposed across a part of the fin-shaped structure 112 and the substrate 110. The gate structure 120 may include a buffer layer (not shown), a dielectric layer 122, a gate layer 124 and a cap layer 126. In details, a buffer layer (not shown), a dielectric layer (not shown), a gate layer (not shown) and a cap layer (not shown) sequentially and entirely cover the fin-shaped structure 112 and the substrate 110. Then, these layers are patterned to form a stacked structure of a buffer layer (not shown), a dielectric layer 122, a gate layer 124 and a cap layer 126.

The buffer layer (not shown) may be selectively formed to buffer the dielectric layer 122 and the fin-shaped structure 112 and the substrate 110. The buffer layer (not shown) may be an oxide layer, but it is not limited thereto. When a gate-last for high-k first process or a gate-first process is applied, the dielectric layer 122 may be a dielectric layer having a high dielectric constant, such as the group selected from hafnium oxide (HfO2), hafnium silicon oxide (HfSiO4), hafnium silicon oxynitride (HfSiON), aluminum oxide (Al2O3), lanthanum oxide (La2O3), tantalum oxide (Ta2O5), yttrium oxide (Y2O3), zirconium oxide (ZrO2), strontium titanate oxide (SrTiO3), zirconium silicon oxide (ZrSiO4), hafnium zirconium oxide (HfZrO4), strontium bismuth tantalite (SrBi2Ta2O9, SBT, lead zirconate titanate (PbZrxTi1-xO3, PZT) and barium strontium titanate (BaxSr1-xTiO3, BST), but it is not limited thereto. In another embodiment, when a polysilicon gate process or a gate-last for high-k last process is applied, the dielectric layer 122 may be an oxide layer, which will be removed and replaced by a dielectric layer having a high dielectric constant in later processes. The gate layer 124 may be a polysilicon sacrificial gate layer, which may be replaced by a metal gate in later processes, but it is not limited thereto. The cap layer 126 is a single layer or a multilayer structure composed of material layers such as a nitride layer or an oxide layer etc, wherein the cap layer 126 is used as a hard mask for etching processes. Moreover, the gate structure 120 may further include a barrier layer (not shown) located between the dielectric layer 122 and the gate layer 124, and the barrier layer (not shown) may be a single layer or a multilayer structure composed of materials such as titanium nitride or tantalum nitride etc.

A spacer 130 is formed on the fin-shaped structure 112 and the substrate 110 beside the gate structure 120. In details, a spacer material (not shown) is formed to conformally cover the cap layer 126, the fin-shaped structure 112 and the substrate 110. The spacer material (not shown) is etched back to form the spacer 130. The spacer 130 may be a single layer or a multilayer structure composed of materials such as silicon nitride or silicon oxide etc.

Figure 3:
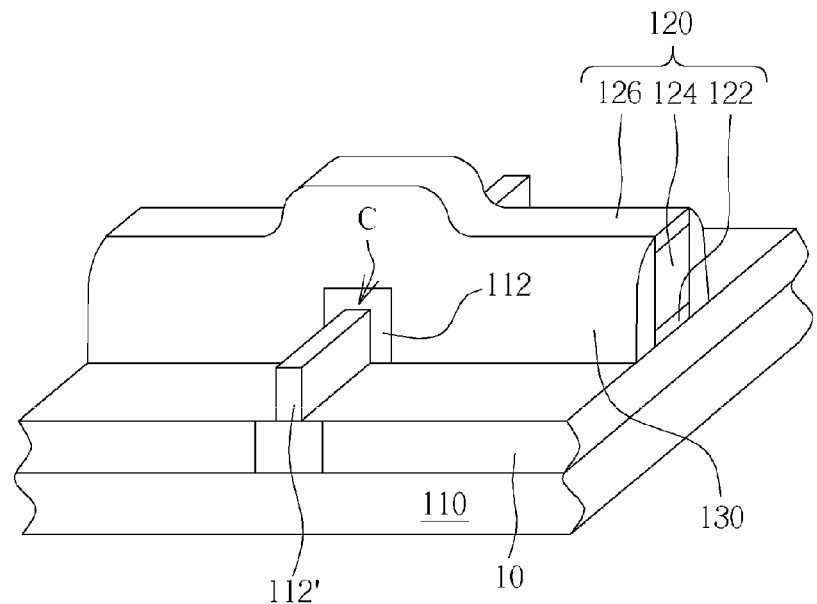

Preferably but optionally, the fin-shaped structure 112 beside the gate structure 120 and the spacer 130 is thinned down, so that, a thinned fin-shaped structure 112' is formed, as shown in FIG. 3. Thus, epitaxial structures formed on the thinned fin-shaped structure 112' in later processes can be closer to a gate channel C at the inner side of the gate structure 120. By doing this, the cross-sectional area of the thinned fin-shaped structure 112' in an extension direction parallel to the gate structure 120 is smaller than the cross-sectional area of the fin-shaped structure 112.

Figure 4:
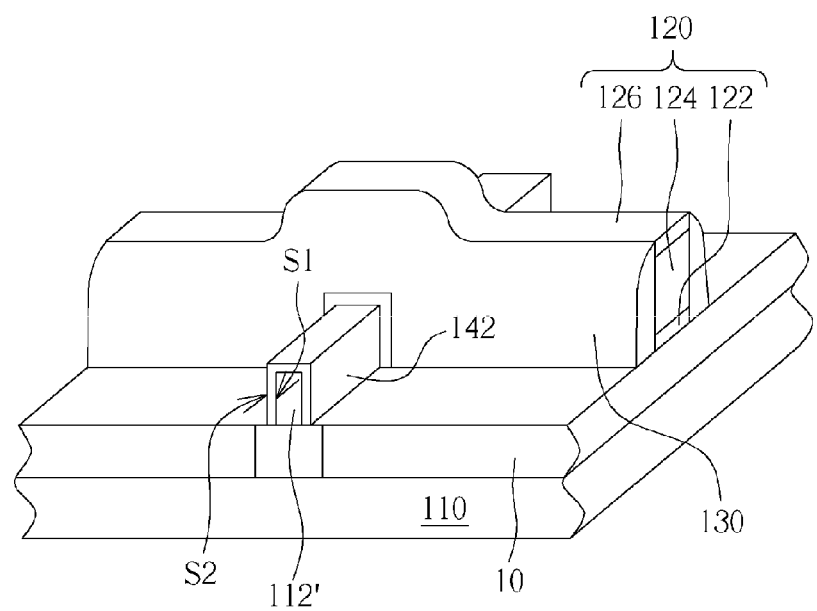

As shown in FIG. 4, a bottom epitaxial structure 142 is formed on the thinned fin-shaped structure 112' beside the gate structure 120 and the spacer 130. In this embodiment, the bottom epitaxial structure 142 covers the thinned fin-shaped structure 112'. The bottom epitaxial structure 142 may be selectively formed to buffer the thinned fin-shaped structure 112' and the epitaxial structure formed in later processes. In this embodiment, the bottom epitaxial structure 142 is a silicon germanium epitaxial structure; but in another embodiment, the bottom epitaxial structure 142 may be a silicon carbide epitaxial structure, a silicon phosphorus epitaxial structure or a carbon-containing silicon phosphorus epitaxial structure etc, depending upon the electrical type of the transistors.

The concentration of germanium in the bottom epitaxial structure 142 has a gradient distribution increasing from bottom to top, so that the lattice difference between the bottom epitaxial structure 142 and the thinned fin-shaped structure 112' or between the bottom epitaxial structure 142 and the substrate 110 can be retarded, so that the surfaces of the bottom epitaxial structure 142 formed on the thinned fin-shaped structure 112' or the substrate 110, or even other epitaxial structures formed on the bottom epitaxial structure 142, can be smoother. In a preferred embodiment, the concentration of germanium of a bottom surface S1 of the bottom epitaxial structure 142 is 0%, to reduce the lattice different between the bottom epitaxial structure 142 and the thinned fin-shaped structure 112' or between the bottom epitaxial structure 142 and the substrate 110 as much as possible. Moreover, due to the concentration of germanium of an epitaxial structure formed in later processes being 55%, the concentration of germanium of a top surface S2 of the bottom epitaxial structure 142 is 55%. The concentration distribution of germanium from the bottom surface S1 to the top surface S2 has a gradient distribution from 0% to 55% from bottom to top, but it is not limited thereto. The concentration of germanium of the top surface S2 of the bottom epitaxial structure 142 depends to epitaxial structures from thereon. In a preferred embodiment, the concentration of germanium of the top surface S2 of the bottom epitaxial structure 142 is lower than or equal to the concentration of germanium of the epitaxial structures.

In this embodiment, the bottom epitaxial structure 142 is a silicon germanium epitaxial structure, and the germanium concentration of the bottom epitaxial structure 142 will be adjusted to achieve the aforesaid purposes. In addition, the bottom epitaxial structure 142 may be also a silicon carbide epitaxial structure, a silicon phosphorous epitaxial structure or a carbon-containing silicon carbide epitaxial structure etc., and the carbon or the phosphorous in the bottom epitaxial structure 142 can also be adjusted to achieve said purposes. To sum up, the concentration of an ingredient of the bottom epitaxial structure 142 is preferred to have a gradient distribution increasing from bottom to top, the ingredient concentration of the bottom surface S1 of the bottom epitaxial structure 142 is preferred to be 0%, and the ingredient concentration of the surface S2 of the bottom epitaxial structure 142 is preferred to be lower than or equal to the ingredient concentration of the epitaxial structure formed thereon in later processes.

Figure 5:
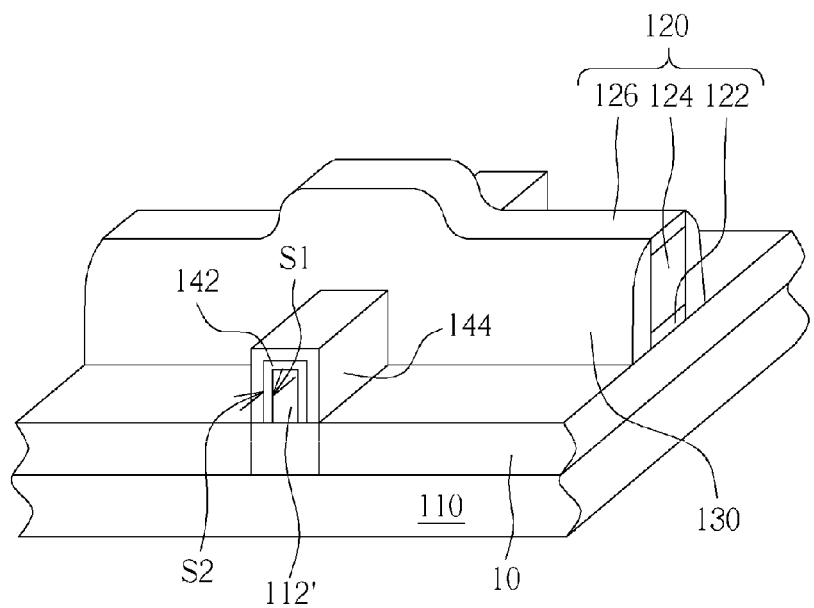

As shown in FIG. 5, an epitaxial structure 144 is formed on the bottom epitaxial structure 142. In this embodiment, the epitaxial structure 144 covers the bottom epitaxial structure 142. In this embodiment, the epitaxial structure 144 is a silicon germanium epitaxial structure, but it is not limited thereto. In another embodiment, the epitaxial structure 144 may be also a silicon carbide epitaxial structure, a silicon phosphorous epitaxial structure or a carbon-containing silicon carbide epitaxial structure etc. This means that the germanium in the epitaxial structure 144 in this embodiment will be replaced by an ingredient in the epitaxial structure 144 such as carbon or phosphorous etc. Stresses forcing the gate channel C originate mainly from the epitaxial structure 144, and the germanium concentration of the epitaxial structure 144 is therefore larger than or equal to the maximum germanium concentration of the bottom epitaxial structure 142 (i.e. the germanium concentration of the top surface S2 of the bottom epitaxial structure 142), and the epitaxial structure 144 has a substantially uniform concentration distribution of germanium. When the epitaxial structure 144 is a silicon carbide epitaxial structure, a silicon phosphorous epitaxial structure or a carbon-containing silicon carbide epitaxial structure etc., the concentration distribution of germanium of the epitaxial structure 144 can correspond to the concentration distribution of carbon or phosphorous etc. Furthermore, the total cross-sectional area of the epitaxial structure 144, the bottom epitaxial structure 142 and the thinned fin-shaped structure 112' in an extension direction perpendicular to the gate structure 120 is preferred to be larger than or equal to the cross-sectional area of the fin-shaped structure 112 right below the gate structure 120.

Figure 6:
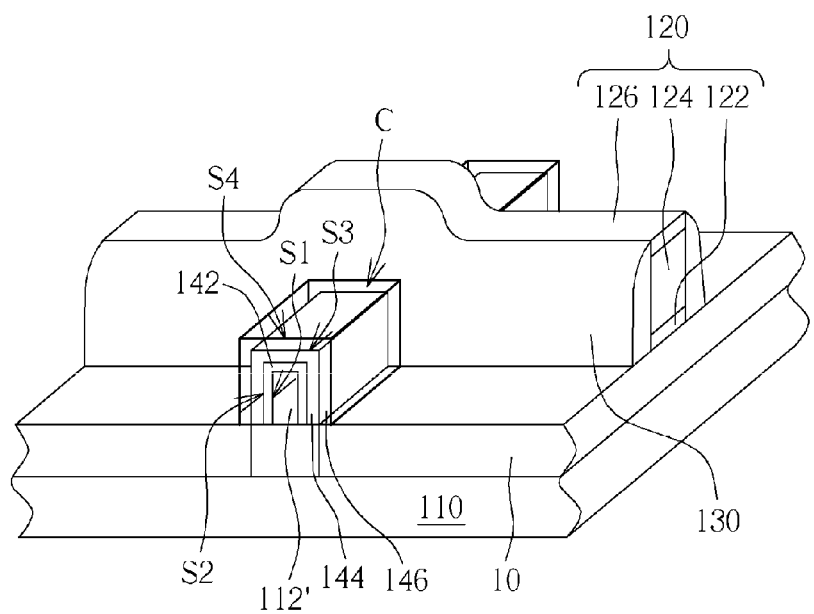

As shown in FIG. 6, a gradient cap layer 146 is formed on the epitaxial structure 144. In this embodiment, the gradient cap layer 146 covers the epitaxial structure 144. In this embodiment, the gradient cap layer 146 is also a silicon germanium epitaxial structure, and the germanium concentration has a gradient distribution decreasing from bottom (inner) to top (outer). Likewise, the gradient cap layer 146 can also be composed of other materials. To sum up, the gradient cap layer 146 is a compound semiconductor, wherein the concentration of one ingredient has a gradient distribution decreasing from bottom (inner) to top (outer). The gradient cap layer 146 can be formed by an in-situ doping process, which imports the ingredient with different ratios along time to form the gradient cap layer 146 having the ingredient concentration decreasing from bottom (inner) to top (outer). The gradient cap layer 146 may include a plurality of stacked cap layers, with the ingredient concentration of these layers decreasing from bottom (inner) to top (outer).

The germanium concentration of a surface S4 of the gradient cap layer 146 is better to be as low as possible, preferably 0%, which is pure silicon. More preferably, pure silicon with some thickness is under the surface S4. This way, the germanium in the gradient cap layer 146, the epitaxial structure 144 or the bottom epitaxial structure 142 can be prevented from diffusing to the surface S4 of the gradient cap layer 146, which leads to the formation of black spots during metal silicide processes, and increases the contact resistance (Rc). Furthermore, the germanium concentration of the epitaxial structure 144 is preferred to be larger than or equal to the germanium concentration of a bottom surface S3 of the gradient cap layer 146. Moreover, the germanium concentration of the bottom surface S3 of the gradient cap layer 146 is better to be close to the germanium concentration of the epitaxial structure 144, so that stresses forcing the gate channel C from the epitaxial structure 144 can be maintained. In other words, part of the stresses forced from the epitaxial structure 144 will not be suppressed or influenced by stresses forced from the gradient cap layer 146. Moreover, the gradient cap layer 146 and the epitaxial structure 144 can have a good interface, enabling the gradient cap layer 146 to be smoothly formed on the epitaxial structure 144. In a still preferred embodiment, the germanium concentration of the epitaxial structure 144 is equal to the germanium concentration of the bottom surface S3 of the gradient cap layer 146. For instance, the germanium concentration of the epitaxial structure 144 is 55% in this embodiment, so that the germanium concentration of the bottom surface S3 of the gradient cap layer 146 is also 55%, and the germanium concentration of gradient cap layer 146 from bottom surface S3 to the top surface S4 is preferred to have a gradient distribution of 55% to 0%. The germanium concentration of the gradient cap layer 146 to the epitaxial structure 144 can therefore be continuous and smooth, but it is not limited thereto.

Above all, the bottom epitaxial structure 142, the epitaxial structure 144 and the gradient cap layer 146 are sequentially formed on the fin-shaped structure 112 in this embodiment, and the bottom epitaxial structure 142, the epitaxial structure 144 and the gradient cap layer 146 all have the same epitaxial structure, a silicon germanium epitaxial structure for example, but with different ratios of an ingredient (such as germanium) concentration. In this way, through adjusting the ingredient concentration, the surfaces of the bottom epitaxial structure 142, the epitaxial structure 144 and the gradient cap layer 146 can be smooth, black spots can be prevented from forming in the surface of the gradient cap layer 146, and stresses forcing the gate channel C from the bottom epitaxial structure 142, the epitaxial structure 144 and the gradient cap layer 146, especially for the epitaxial structure 144, can be maintained.

Moreover, the bottom epitaxial structure 142, the epitaxial structure 144 and the gradient cap layer 146 all just have one layer in this embodiment, but the bottom epitaxial structure 142, the epitaxial structure 144 and the gradient cap layer 146 may include multi-layers in another embodiment, depending upon the needs. The bottom epitaxial structure 142, the epitaxial structure 144 and the gradient cap layer 146 are preferred to be epitaxial structures with the same compound semiconductor such as silicon germanium epitaxial structures, but with different concentration distribution of an ingredient such as germanium. So, rough contact surfaces between these layers caused by lattice differences between the bottom epitaxial structure 142, the epitaxial structure 144 and the gradient cap layer 146 can be reduced, but it is not limited thereto, which means that the bottom epitaxial structure 142, the epitaxial structure 144 and the gradient cap layer 146 may have different epitaxial structures.

To summarize, the present invention provides a Multi-Gate Field-Effect Transistor and a process thereof, including selectively forming the bottom epitaxial structure on the fin-shaped structure, forming the epitaxial structure on the bottom epitaxial structure and forming the gradient cap layer on the epitaxial structure, and adjusting the concentration distribution of an ingredient of the bottom epitaxial structure, the epitaxial structure and the gradient cap layer. For example, the ingredient of the bottom epitaxial structure has a gradient distribution increasing from bottom to top, the concentration distribution of the ingredient of the epitaxial structure has a uniform concentration distribution, and the ingredient of the gradient cap layer has a gradient distribution decreasing from bottom (inner) to top (outer). In this way, the bottom epitaxial structure, the epitaxial structure and the gradient cap layer formed on the fin-shaped structure can be smooth, black spots in the surface of the gradient cap layer can be avoided, stresses forcing the gate channel from the bottom epitaxial structure, the epitaxial structure and the gradient cap layer, especially from the epitaxial structure, can be maintained.

Moreover, the ingredient concentration of the bottom surface of the bottom epitaxial structure is preferred to be 0%. The ingredient concentration of the top surface of the bottom epitaxial structure is preferred to be lower than or equal to the ingredient concentration of the epitaxial structure. The ingredient concentration of the surface of gradient cap layer is preferred to be 0%. The ingredient concentration of the bottom surface of the gradient cap layer is preferred to be lower than or equal to the ingredient concentration of the epitaxial structure. More precisely, the bottom epitaxial structure, the epitaxial structure and the gradient cap layer are preferred to have a gradually changing concentration distribution of the ingredient to better achieve the purposes. For instance, the concentration distribution of the ingredient of the bottom epitaxial structure from the bottom surface to the surface is from 0% to 55%, the concentration of the ingredient of the epitaxial structure is 55%, and the concentration distribution of the ingredient of the gradient cap layer from the bottom surface to the surface is from 55% to 0%.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A Multi-Gate Field-Effect Transistor fabrication process comprising:
    forming a fin-shaped structure on a substrate;
    forming a gate structure disposed across part of the fin-shaped structure and the substrate;
    at least forming an epitaxial structure on the fin-shaped structure beside the gate structure;
    forming a bottom epitaxial structure on the fin-shaped structure beside the gate structure before the epitaxial structure is formed, and the concentration of the ingredient in the bottom epitaxial structure has a gradient distribution increasing from bottom to top; and
    forming a gradient cap layer on the epitaxial structures, wherein the gradient cap layer is a compound semiconductor, and the concentration of an ingredient of the gradient cap layer has a gradient distribution decreasing from inner to outer.

2. The Multi-Gate Field-Effect Transistor process according to claim 1, wherein the concentration of the ingredient of epitaxial structure is larger than or equal to the concentration of the ingredient of a bottom surface of the gradient cap layer.

3. The Multi-Gate Field-Effect Transistor process according to claim 1, wherein the concentration of the ingredient of a surface of the gradient cap layer is 0%.

4. The Multi-Gate Field-Effect Transistor process according to claim 1, wherein forming the gradient cap layer comprises forming a plurality of stacked cap layers.

5. The Multi-Gate Field-Effect Transistor process according to claim 1, wherein the concentration of the ingredient of a bottom surface of the bottom epitaxial structure is 0%.

6. The Multi-Gate Field-Effect Transistor process according to claim 1, wherein the concentration of the ingredient of epitaxial structure is larger than or equal to the concentration of the ingredient of a top surface of the bottom epitaxial structure.

7. The Multi-Gate Field-Effect Transistor process according to claim 1, further comprising: thinning down the fin-shaped structure beside the gate structure after the gate structure is formed.

* * * * *